(12) United States Patent
Davidson et al.

(10) Patent No.: US 10,464,155 B2
(45) Date of Patent: Nov. 5, 2019

(54) WAVEFORM COMPENSATION SYSTEMS AND METHODS FOR SECONDARY WELD COMPONENT RESPONSE

(71) Applicant: ILLINOIS TOOL WORKS INC., Glenview, IL (US)

(72) Inventors: Robert R. Davidson, New London, WI (US); Thomas A. Bunker, DePere, WI (US); Richard Schuh, Freedom, WI (US)

(73) Assignee: Illinois Tool Works Inc., Glenview, IL (US)

( * ) Notice: Subject to any disclaimer, the term of this patent is extended or adjusted under 35 U.S.C. 154(b) by 280 days.

(21) Appl. No.: 15/341,741

(22) Filed: Nov. 2, 2016

(65) Prior Publication Data

US 2017/0072498 A1    Mar. 16, 2017

Related U.S. Application Data

(62) Division of application No. 13/756,048, filed on Jan. 31, 2013, now Pat. No. 9,506,958.

(51) Int. Cl.
*B23K 9/10* (2006.01)
*G01R 19/25* (2006.01)
(Continued)

(52) U.S. Cl.
CPC .............. *B23K 9/1006* (2013.01); *B23K 9/09* (2013.01); *B23K 9/0953* (2013.01); *G01R 19/2506* (2013.01)

(58) Field of Classification Search
CPC ...... B23K 9/09; B23K 9/1006; B23K 9/0953; G01R 19/2506
(Continued)

(56) References Cited

U.S. PATENT DOCUMENTS 5,315,089 A    5/1994    Hughes
5,756,967 A    5/1998    Quinn
(Continued)

FOREIGN PATENT DOCUMENTS

CN    101777823    7/2010
CN    102216019    10/2011
(Continued)

OTHER PUBLICATIONS

International Search Report from PCT application No. PCT/US2014/011937, dated May 23, 2014, 10 pgs.

*Primary Examiner* — Thien S Tran

(74) *Attorney, Agent, or Firm* — McAndrews, Held & Malloy, Ltd.

(57) ABSTRACT

A method includes receiving data corresponding to a voltage level over time and a current level over time. The method also includes determining a first ratio corresponding to a voltage ramp percent or a voltage falling edge percent with respect to a peak in the voltage level and determining a second ratio corresponding to a current ramp ratio or a current falling edge ratio with respect to a peak in the current level. The method further includes determining, based on a comparison between the first ratio and the second ratio, whether to increment, decrement, or maintain an inductance compensation estimation value corresponding to an estimated inductance present in one or more secondary components associated with the welding operation.

19 Claims, 5 Drawing Sheets

(51) Int. Cl.
*B23K 9/09* (2006.01)
*B23K 9/095* (2006.01)

(58) Field of Classification Search
USPC ........ 219/109, 124.1, 130.01, 130.1, 130.21, 219/130.31, 130.33
See application file for complete search history.

(56) References Cited

U.S. PATENT DOCUMENTS

| | | |
|---|---|---|
| 6,248,976 B1 | 6/2001 | Blankenship |
| 6,265,688 B1 | 7/2001 | Lyshkow |
| 6,359,258 B1 | 3/2002 | Blankenship |
| 6,596,970 B2 | 7/2003 | Blankenship |
| 6,710,297 B1 | 3/2004 | Artelsmair |
| 6,906,284 B2 | 6/2005 | Kim |
| 7,244,905 B2 | 7/2007 | Das |
| 7,683,290 B2 | 3/2010 | Daniel |
| 2008/0264916 A1 | 10/2008 | Nagano |
| 2010/0133250 A1 | 6/2010 | Sardy |
| 2010/0308027 A1* | 12/2010 | Vogel ................ B23K 9/0953 219/130.21 |
| 2010/0314371 A1 | 12/2010 | Davidson |
| 2013/0092672 A1* | 4/2013 | Peters ................ B23K 9/0953 219/130.31 |

FOREIGN PATENT DOCUMENTS

| | | |
|---|---|---|
| CN | 102254908 | 11/2011 |
| DE | 10064725 | 7/2002 |
| FR | 2850463 | 7/2004 |
| RU | 2428703 | 9/2011 |
| WO | 2010141435 | 12/2010 |

* cited by examiner

WAVEFORM COMPENSATION SYSTEMS AND METHODS FOR SECONDARY WELD COMPONENT RESPONSE

CROSS REFERENCE TO RELATED APPLICATIONS

This application is a Divisional Application of U.S. patent application Ser. No. 13/756,048, entitled "Waveform Compensation Systems and Methods for Secondary Weld Component Response", filed Jan. 31, 2013, which is hereby incorporated by reference in its entirety for all purposes.

BACKGROUND

The invention relates generally to welding systems, and, more particularly, to systems and methods for compensation of an error in a secondary component of a welding system.

Welding is a process that has become ubiquitous in various industries and applications, such as construction, ship building, and so forth. Welding systems typically include a variety of secondary components, which may include secondary cabling as well as secondary equipment. Such secondary components may include welding torches, weld fixturing, weld cables, and so forth, and certain parameters of these secondary components may impact the quality of the weld obtained in a welding operation. For example, weld cables generally have associated resistance and inductance values. Due to the high current levels associated with typical welding processes, these inductance and resistance values often lead to voltage errors. In many instances, these voltage errors may lead to a decrease in the quality of the weld because voltage is used to control parameters of the welding arc.

Some previous systems have attempted to address the foregoing problem to reduce or eliminate the likelihood of experiencing the aforementioned decrease in weld quality due to the features of the secondary cabling. For example, some systems may utilize a non-current carrying voltage sensing lead that extends from the weld power supply to the end of the weld cables. Such voltage sensing leads may be utilized to sense the voltage at the weld without being affected by the voltage error generated by the weld cables. However, many weld environments are already cluttered with a variety of cables and other structures, and the addition of an extra cable may be undesirable. Accordingly, there exists a need for improved systems and methods for the compensation of errors introduced into the weld operation by secondary components, such as weld cabling.

BRIEF DESCRIPTION

In one embodiment, a method includes receiving first data corresponding to a first weld waveform generated during a welding operation, wherein the first weld waveform corresponds to a stud voltage level over time. The method also includes receiving second data corresponding to a second weld waveform generated during the welding operation, wherein the second weld waveform corresponds to a current level over time. The method further includes determining, based on the first data, a first percent corresponding to a stud voltage ramp percent or a stud voltage falling edge percent with respect to a peak in the first weld waveform and determining, based on the second data, a second percent corresponding to a current ramp percentage or a current falling edge percent with respect to a peak in the second weld waveform. The method also includes determining, based on a comparison between the first percent and the second percent, a stud voltage for the welding operation that compensates for an inductance level present in one or more secondary components associated with the welding operation.

In another embodiment, a method includes receiving first data corresponding to a first weld waveform generated during a welding operation, wherein the first weld waveform corresponds to a stud voltage level over time, and receiving second data corresponding to a second weld waveform generated during the welding operation, wherein the second weld waveform corresponds to a current level over time. The method also includes determining, based on the first data, a first percent corresponding to a stud voltage ramp percent or a stud voltage falling edge percent with respect to a peak in the first weld waveform and determining, based on the second data, a second percent corresponding to a current ramp percentage or a current falling edge percent with respect to a peak in the second weld waveform. The method further includes determining, based on a comparison between the first percent and the second percent, whether to increment, decrement, or maintain an inductance compensation estimation value corresponding to an estimated inductance present in one or more secondary components associated with the welding operation.

In another embodiment, a welding system includes a welding power supply that supplies power for a welding operation, a welding torch coupled to the welding power supply via a torch cable, a fixture that secures a workpiece in a welding location, and a ground cable coupled to the welding power supply and at least one of the fixture and the workpiece. The welding system also includes control circuitry that in operation monitors a measured stud voltage; periodically determines, throughout the welding operation, whether to increment, decrement, or maintain an inductance compensation estimation value corresponding to an estimated inductance present in one or more secondary components associated with the welding operation; and utilizes the inductance compensation estimation value to periodically determine, throughout the welding operation, a compensated stud voltage.

DRAWINGS

These and other features, aspects, and advantages of the present invention will become better understood when the following detailed description is read with reference to the accompanying drawings in which like characters represent like parts throughout the drawings, wherein.

Figure 5:
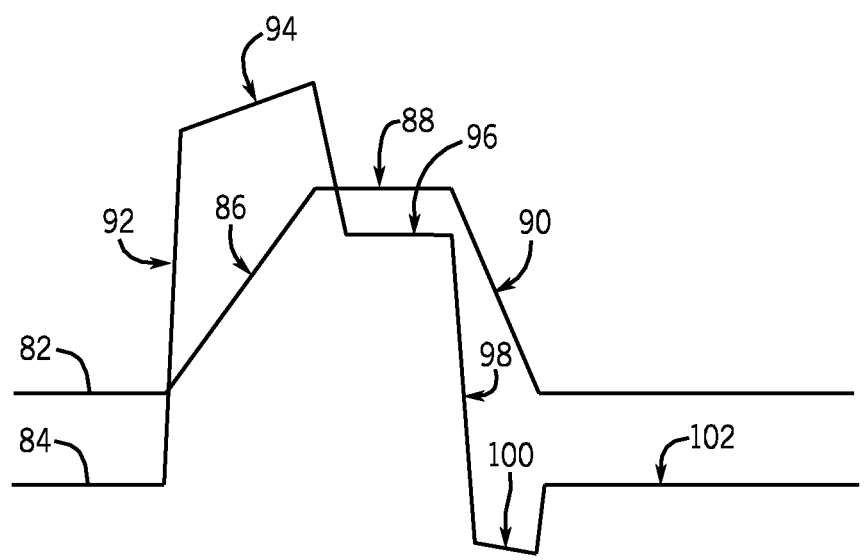
Figure 6A:
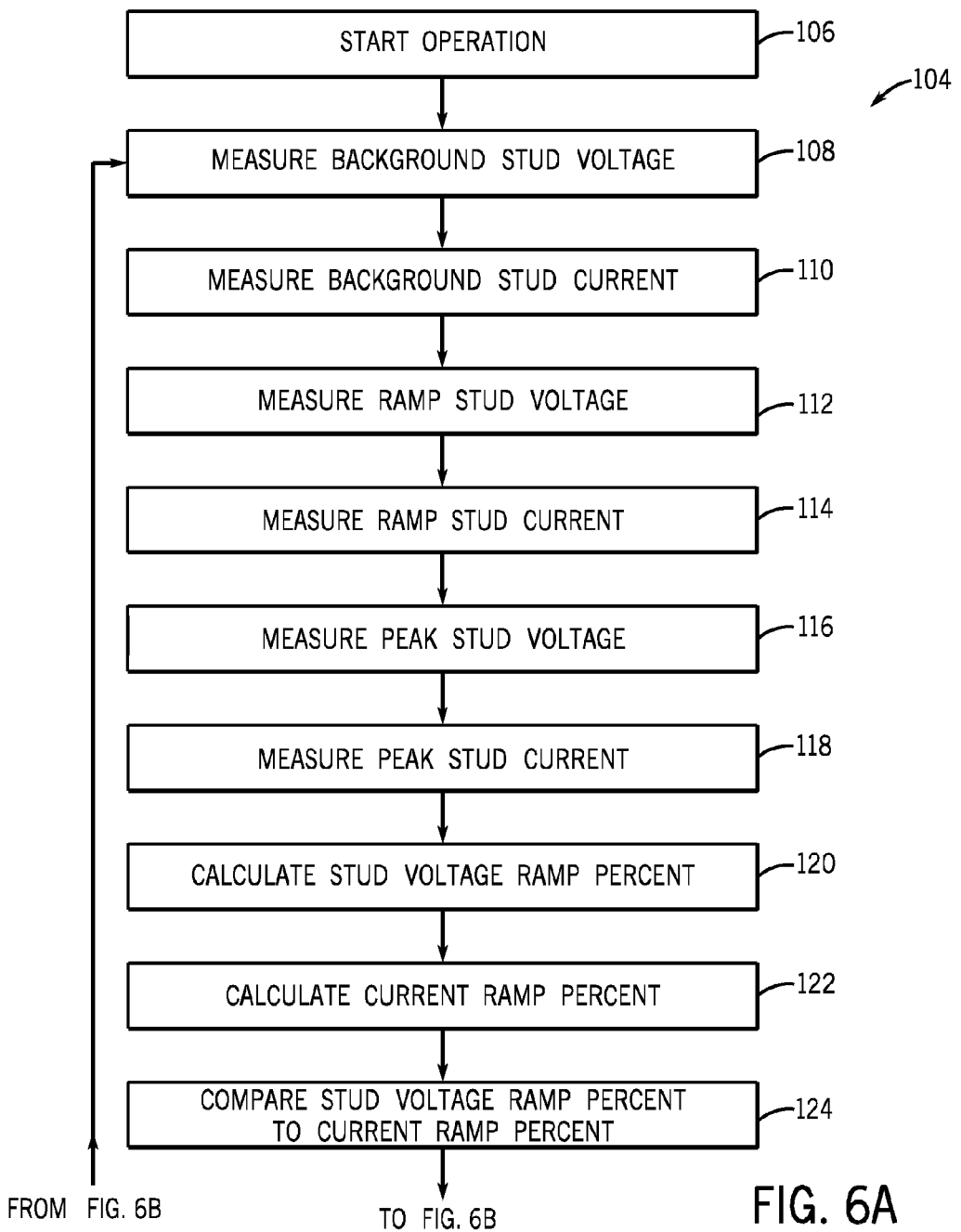
Figure 6B:
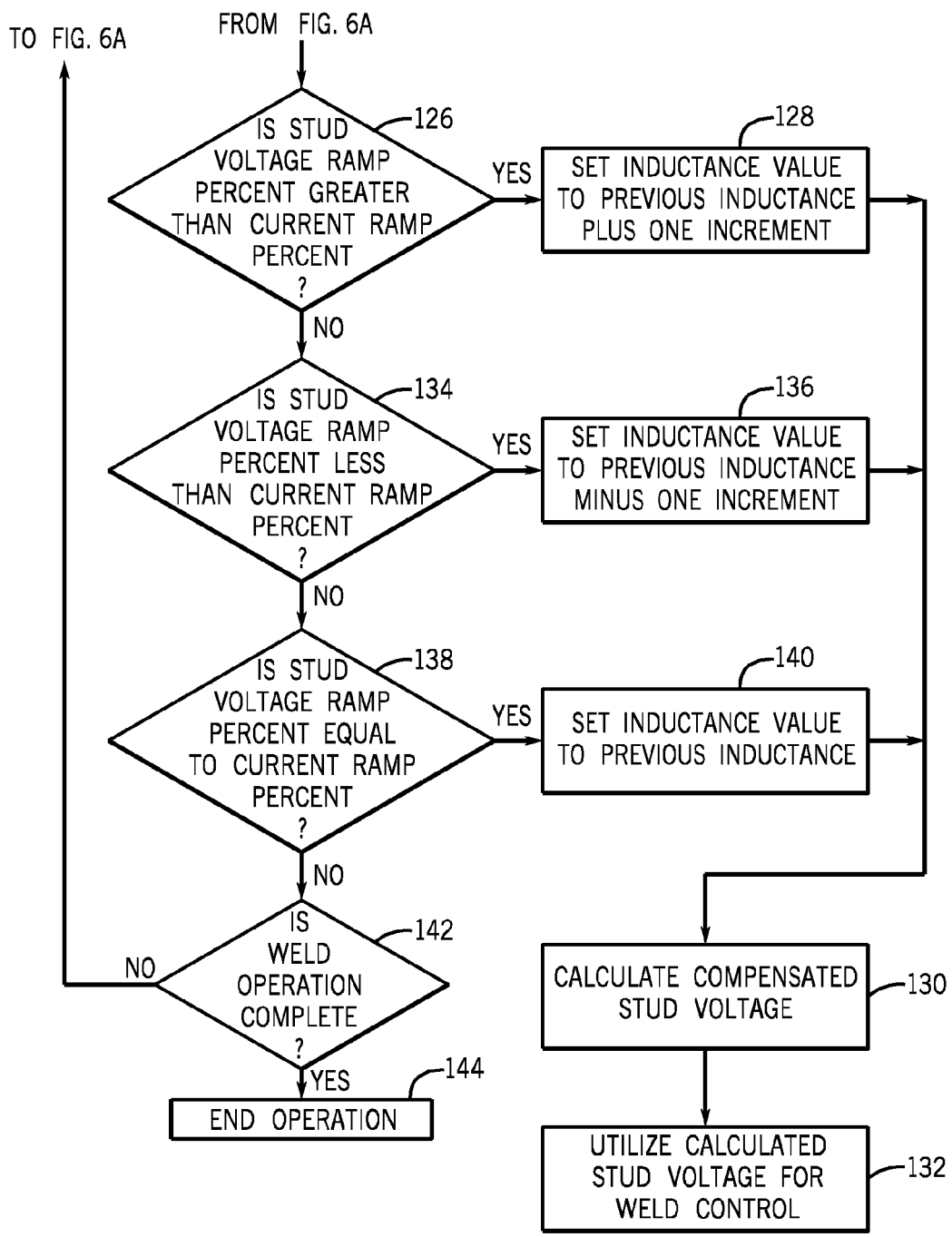

FIG. 5 is a schematic illustrating a stud current waveform and a stud voltage waveform affected by weld cable inductance in accordance with an embodiment; and FIGS. 6A and 6B are a flow chart illustrating an embodiment of a method that may be utilized by a weld controller to compensate for a secondary component error introduced by secondary weld components by considering a ramp portion of a weld waveform.

DETAILED DESCRIPTION

As described in detail below, embodiments are provided of systems and methods that may be utilized to compensate a weld voltage utilized for control of a welding operation for an error associated with a secondary weld component, such as weld cabling. For example, such systems and methods may enable identification of a secondary weld error in the form of an inductance or resistance error due to weld cabling. That is, in certain instances, although the weld cabling may present relatively small inductances and resistances, the voltage errors introduced into the weld system may be significant because of the amount of current typically used in a welding operation. In some instances, the voltage errors may be further increased as the length (e.g., approximately 100 feet or more) of the weld cabling increases.

Accordingly, in some embodiments disclosed herein, weld control circuitry may be provided such that acquired information regarding the welding operation may be utilized to compensate for a voltage error introduced into the system by one or more secondary components. For example, in some embodiments, the controller may utilize information regarding the weld cabling to determine an appropriate voltage error compensation routine for the given welding setup. For further example, in certain embodiments, a control loop may be utilized to periodically adjust the weld voltage used to control the weld operation based on a minimization of the voltage error. These and additional features of the provided weld controllers and methods are described in more detail below.

The compensation systems and methods disclosed herein may provide a variety of distinct advantages when compared to traditional techniques. For example, the provided embodiments enable a welding arc to be compensated for a secondary response, such as the inductance and resistance of the weld cables, without the need for voltage sensing leads. That is, whereas some prior systems utilized non-current carrying leads to sense voltage at the weld location in such a way that bypasses the voltage error generated in the weld cables, presently disclosed embodiments may enable a reduction or elimination of this additional cabling. Still further, by comparing one or more weld waveforms to one or more desired weld waveforms, certain embodiments of the controllers disclosed herein may be capable of controlling the welder in an adaptive manner such that the generated weld command takes into account both the capability of the given welder as well as the secondary response associated, for example, with the weld cables.

Figure 1:
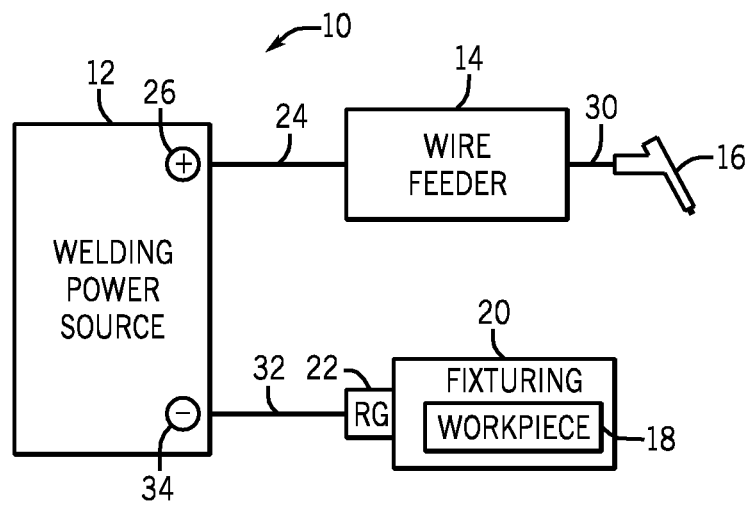
FIG. 1 is a schematic illustrating a welding system in accordance with embodiments of the present invention.

Turning now to the drawings, FIG. 1 illustrates a welding system 10 including a welding power source 12, a wire feeder 14, a welding torch 16, and a workpiece 18 positioned on fixturing 20 with rotary ground 22. In the illustrated embodiment, a positive weld lead 24 couples a positive terminal 26 of the welding power source 12 to the wire feeder 14. Further, a cable 30 couples the wire feeder to the welding torch 16. Additionally, a negative weld lead 32 couples a negative terminal 34 of the welding power source 12 to the rotary ground 22.

During operation, the welding power source 12 provides power to the welding torch 16 through the wire feeder 14, which provides wire for the welding operation. Further, during use, a welding operator utilizes the welding torch 16 to weld the workpiece 18. While welding, high current levels associated with the welding process may degrade the secondary cabling and/or equipment, and after many welding cycles, degradation of the secondary cabling and/or equipment may impact the quality of the weld. As such, certain embodiments of the present invention provide for compensation for voltage errors that may result from inductance and/or resistance errors introduced by weld secondary components, such as the weld cabling. Such voltage errors may be utilized by a weld controller to generate a weld command that compensates for the secondary response in a given welding system.

Figure 2:
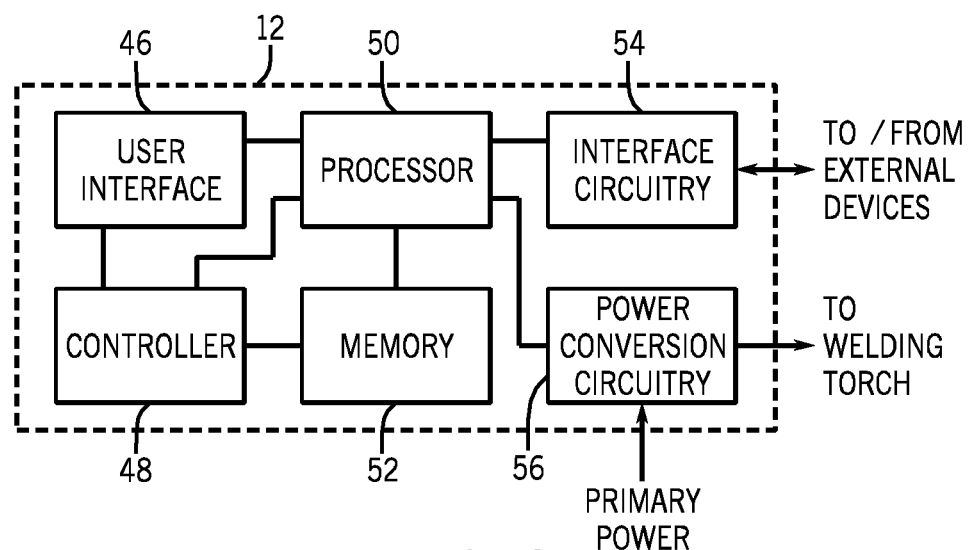
FIG. 2 is a block diagram illustrating exemplary components of the welding power source of FIG. 1 in accordance with embodiments of the present invention.

FIG. 2 illustrates example components of the welding power source 12 of FIG. 1. In the illustrated embodiment, the welding power source 12 includes a user interface 46, a controller 48, a processor 50, memory 52, interface circuitry 54, and power conversion circuitry 56. During use, the power conversion circuitry 56 receives primary power from a primary source, such as a wall outlet, a power grid, and so forth, and converts such power to an appropriate welding output for transfer to the welding torch 16. The processor 50 is configured to receive a variety of inputs regarding wire feeder operation, user choices, voltage feedback, current feedback, power feedback, resistance feedback, inductance feedback, and so forth, to process such inputs, and to generate a variety of suitable outputs that guide operation of the welding power source 12. For example, the interface circuitry 54 may receive feedback from one or more external devices (e.g., wire feeder 14, auxiliary devices, etc.), communicate such feedback to the processor 50, receive an output signal from the processor 50, and communicate such a signal to the one or more external devices.

Still further, the processor 50 may receive user inputs from the user interface 46 regarding the welding operation. For example, the processor 50 may receive commands regarding the chosen welding process, parameters of the welding process (e.g., current level, voltage level, etc.), and so forth, and process such inputs. The processor 50 may also receive one or more inputs from the controller 48, which may be configured to execute one or more algorithms utilized to guide the welding process and/or any other functions of the welding power source 12. For example, in one embodiment, the controller 48 may execute a series of commands to determine the magnitude of the voltage error introduced by the secondary weld cabling and/or equipment. Acquired measurement data may then be communicated to the processor via interface circuitry 54, which may process the received information to determine, for example, an appropriate weld command that takes into account the determined voltage error introduced by the secondary weld components.

In certain embodiments, if desired, such information may be communicated to the user, for example, via user interface 46. To that end, user interface 46 may be capable of communicating with the user via visual cues (e.g., light illumination, display panel message, etc.), audio cues (e.g., error message recites error), or any other suitable communication mechanism. In one embodiment, the user interface 46 may be utilized to notify a user when the voltage error introduced, for example, by weld cable inductance, calls for a compensation routine that exceeds the ability of the power source 12. For example, in instances in which the power source 12 would have to increase the voltage output beyond the upper limit of the driving voltage capability of the power source in order to compensate for the inductance introduced by the weld cables, the user interface 46 may communicate the presence of an error to the user. For further example, the user interface 46 may also be utilized to communicate to the user that it would be advantageous to reroute or realign the weld cables within the welding system.

A variety of algorithms and control schemes, not limited to those described in detail below, may be implemented by the controller 48 of FIG. 2 to compensate for the voltage errors introduced by the secondary weld components, such as the weld cabling. For example, the controller may consider the voltage error introduced into the weld waveform while ramping up to or falling down from a local peak in a weld waveform. Indeed, in certain embodiments, the controller may consider both the ramping up portion and the falling edge portion of the weld waveform, or may consider only one desired portion of the waveform.

As described in more detail below with respect to the presently disclosed methods, in some embodiments, the compensation method implemented by the controller 48 includes analyzing one or more weld waveforms during a ramping portion of the waveforms during which weld parameters are ramping up to peak values and comparing ramp percentages calculated for each of the waveforms. For example, in one embodiment, a stud voltage ramp percent and a current ramp percent may be compared to determine an appropriate type and/or amount of change that should be made to the weld voltage control command. In this way, a voltage error that occurs due to the secondary response may be reduced or eliminated in the feedback control signal, thereby enabling the stud voltage command to be compensated for the errors introduced by the weld secondary components. Again, it should be noted that the foregoing feature of presently disclosed embodiments may offer advantages over traditional systems that utilize voltage sensing leads to obtain the necessary data to compensate for secondary weld errors.

Figure 3:
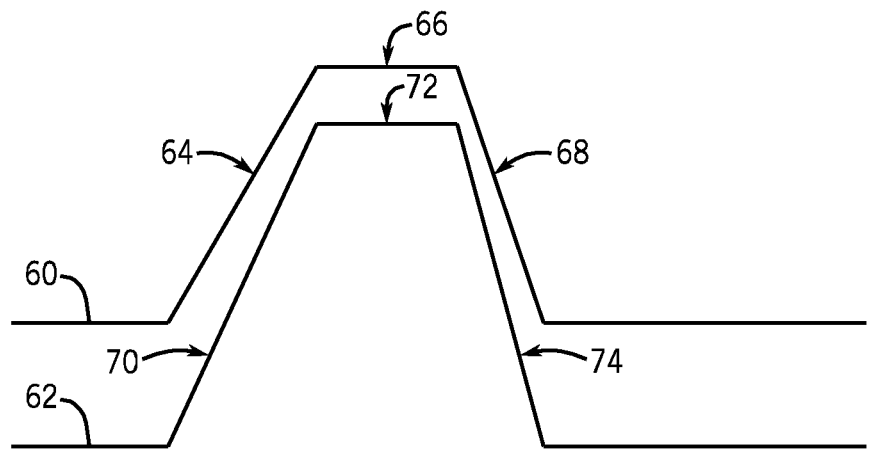
FIG. 3 is a schematic illustrating an ideal current waveform and an ideal stud voltage waveform in accordance with an embodiment of the present invention.

It should be noted that to facilitate understanding of the foregoing methods, it may be helpful to consider the stud current waveform and the stud voltage waveform that would be realized if no secondary weld errors (e.g., inductance errors) were present due to secondary components (e.g., weld cabling). Such waveforms are illustrated in FIG. 3, and these waveforms are normalized and superimposed on one another in FIG. 4. In contrast, FIG. 5 illustrates example stud voltage and current waveforms that may be obtained when secondary weld errors, such as inductance errors, are introduced by the secondary weld components, such as the weld cabling. The following description discusses such waveforms in more detail.

FIG. 3 illustrates an example stud current waveform 60 and an example stud voltage waveform 62 that may be obtained in one welding system if no inductance (or other secondary weld error) is present due to weld cabling. It should be noted that the relative shapes of the waveforms 60 and 62 are substantially similar, but the scaling and amplitude of the waveforms 60 and 62 differ due to the difference in current measurement units (e.g., amps) and stud voltage measurement units (e.g., volts). For instance, as shown, the example stud current waveform 60 includes a ramping portion 64, a peak portion 66, and a falling edge portion 68. Similarly, the example stud voltage waveform 62 includes a ramping portion 70, a peak portion 72, and a falling edge portion 74. Accordingly, if the waveforms 60 and 62 are normalized to a percentage, the waveforms 60 and 62 could be superimposed and have a background portion 76, a ramping portion 78, and a peak portion 80, as shown in FIG. 4.

Figure 4:
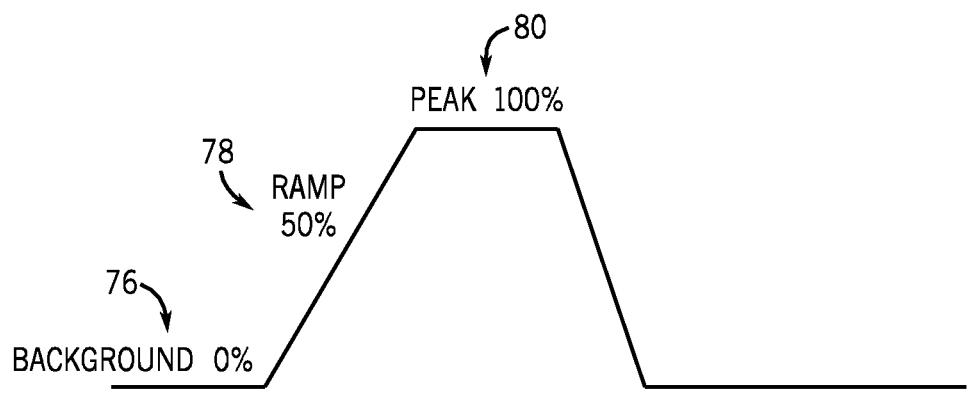
FIG. 4 is a schematic illustrating a normalized stud voltage waveform superimposed on a normalized stud current waveform in accordance with an embodiment.

While the weld waveforms in FIGS. 3 and 4 are representative of example desired waveforms obtainable without the presence of secondary weld errors, the weld waveforms associated with a given welding operation typically differ from these forms due to the presence of secondary weld errors. For example, in many instances, due to the inductance introduced by the weld cabling, the stud voltage will rise above the level in the desired waveform while ramping. An example of a normalized stud current waveform 82 and a normalized stud voltage waveform 84 for an example instance in which inductance is introduced by weld cabling is shown in FIG. 5.

As shown, the normalized stud current waveform 82 still includes a ramping portion 86, a peak portion 88, and a falling portion 90, as before. However, the normalized stud voltage waveform 84 includes a rising portion 92 and an increased portion 94 in which the voltage rises to levels beyond the peak voltage 96 before falling, as indicated by portion 98, to a level 100 before stabilization at level 102. As appreciated by those skilled in the art, the magnitude of the voltage rise is typically determined by multiplying the derivative of stud current over time by the inductance present in the weld cables.

FIGS. 6A and 6B are a flow chart illustrating an embodiment of a method 104 that may be utilized by the weld controller 48 to determine a compensated stud voltage that takes into account the secondary weld errors present in the system, and to utilize the compensated stud voltage for weld control. As illustrated, the method 104 is initiated (block 106), and the background stud voltage and current are measured (blocks 108 and 110). For example, the levels of the stud voltage and stud current during portion 76 of the waveform shown in FIG. 4 are measured. Further, additional measurements are taken that correspond to, for example, portion 78 of the waveform shown in FIG. 4. Specifically, method 104 calls for measurement of the ramp stud voltage (block 112) and the ramp stud current (block 114). Additionally, the peak stud voltage and peak current are also measured (blocks 116 and 118).

Further, the method 104 includes a series of calculations that are performed based on the acquired measurements. In the illustrated embodiment, the method 104 includes a calculation of a stud voltage ramp percent (block 120). For example, in some embodiments, the following equation may be utilized to calculate the stud voltage ramp percent:

$$\text{Stud Voltage Ramp Percent} = \frac{100\% * (\text{Ramp Stud Volts} - \text{Background Stud Volts})}{(\text{Peak Stud Volts} - \text{Background Stud Volts})},$$

wherein Ramp Stud Volts is the voltage during the ramping portion of the stud voltage waveform, Background Stud Volts is the background voltage, and Peak Stud Volts is the voltage at the peak of the stud voltage waveform. Accordingly, in the illustrated embodiment, the method 104 calls for normalization of the ramping portion of the stud voltage waveform with respect to the peak stud voltage.

However, it should be noted that in other embodiments, a stud voltage falling edge percent may be determined instead of or in addition to the stud voltage ramp percent. In such embodiments, the following equation may be utilized to calculate the stud voltage falling edge percent:

$$\text{Stud Voltage Falling Percent} = \frac{100\% * (\text{Falling Stud Volts} - \text{Background Stud Volts})}{(\text{Peak Stud Volts} - \text{Background Stud Volts})},$$

wherein Falling Stud Volts is the voltage during the falling edge portion of the stud voltage waveform.

Similar to the calculation performed for the stud voltage, the illustrated method 104 includes a calculation of a current ramp percent (block 122). For example, in some embodiments, the following equation may be utilized to calculate the current ramp percent:

$$\text{Current Ramp Percent} = \frac{100\% * (\text{Ramp Current} - \text{Background Current})}{(\text{Peak Current} - \text{Background Current})},$$

wherein the Ramp Current is the current during the ramping portion of the current waveform, Background Current is the current during the background portion of the current waveform, and Peak Current is the current at the peak of the current waveform. Accordingly, in the illustrated embodiment, the method 104 calls for normalization of the ramping portion of the current waveform with respect to the peak current (or an average of the peak current if fluctuations are present).

However, it should be noted that in other embodiments, a current falling edge percent may be determined instead of or in addition to the current ramp percent. In such embodiments, the following equation may be utilized to calculate the current falling edge percent:

$$\text{Current Falling Percent} = \frac{100\% * (\text{Falling Current} - \text{Background Current})}{(\text{Peak Current} - \text{Background Current})},$$

wherein Falling Current is the current during the falling edge portion of the current waveform.

In the illustrated embodiment, once the stud voltage ramp percent and the current ramp percent are determined in steps 120 and 122, the values are compared (block 124), and the welding operation is controlled based on this comparison, as described in more detail below. However, it should be noted that in other embodiments, the stud voltage falling edge percent and the current falling edge percent may instead be computed and subsequently compared. In further embodiments, the stud voltage ramp percent, the current ramp percent, the stud voltage falling edge percent, and the current falling edge percent may all be determined and percentages obtained for the corresponding portions of the stud voltage and current waveforms may be compared. Indeed, in presently contemplated embodiments, any desired portion or portions of the waveforms may be normalized and compared for control purposes based on implementation-specific considerations.

However, in the illustrated embodiment, the method 104 proceeds by performing a check inquiring as to whether the stud voltage ramp percent is greater than the current ramp percent (block 126). If this condition is satisfied, an inductance compensation estimation value is increased by a desired increment (block 128). For example, in one embodiment, the estimation value may be set to the old estimation value plus one increment. In certain embodiments, the estimation value may be initially set, for example, to 0, 1, or any other desired value, based on implementation-specific considerations, such as the type or length of the weld cables being utilized in the given welding operation.

Once an updated inductance compensation estimation value is obtained in this manner, a compensated stud voltage is calculated (block 130), and the compensated stud voltage is then utilized for weld control (block 132), thereby enabling the weld process to be corrected for one or more secondary weld errors present in the given welding system. For example, in one embodiment, the compensated stud voltage may be calculated with the following equation:

Compensated Stud Voltage=Measured Stud Voltage−(Estimated Inductance*$dI/dT$).

Alternatively, if the condition of block 126 is not met (i.e., the stud voltage ramp percent is not greater than the current ramp percent), an inquiry is performed as to whether the stud voltage ramp percent is less than the current ramp percent (block 134). If this condition is satisfied, the inductance compensation estimation value is decreased by a desired increment (block 136). For example, in one embodiment, the estimation value may be decremented to equal the old estimation value minus one increment. Once the estimation value is determined in this manner, the compensated stud voltage is calculated (block 130) and utilized for weld control (block 132) as before.

Alternatively, if the condition of block 134 is not met (i.e., the stud voltage ramp percent is not less than the current ramp percent), an inquiry is performed as to whether the stud voltage ramp percent is equal to the current ramp percent (block 138). If this condition is satisfied, the inductance compensation estimation value is maintained at its current level (block 140). Once the estimation value is determined in this manner, the compensated stud voltage is calculated (block 130) and utilized for weld control (block 132) as before. The method 104 may proceed in this manner until upon inquiry (block 142), the controller 48 becomes aware that the weld operation is complete, and the operation is ended (block 144).

In this manner, the normalized stud voltage during the ramping (or falling) portion of the stud voltage waveform may be compared to the normalized current during the ramping (or falling) portion of the current waveform to identify the presence and direction of the secondary component error and to compensate for the given error. That is, by adjusting the estimated inductance value (and the compensated stud voltage based on this estimated value), the stud voltage ramp (or falling) percent may be forced to effectively equal to current ramp percent. When this equalization is achieved, the welding system may be considered to be in a compensated state in which the errors introduced by the secondary weld components have been taken into account.

Again, it should be noted that although the illustrated embodiment measures the voltage error present while the weld waveforms are ramping up to a peak (e.g., portion 78 of the waveform of FIG. 4), in other embodiments, the voltage error may be measured while the weld waveforms are falling down from the peak. In either embodiment, however, secondary weld errors (e.g., inductance errors due to weld cabling) may be compensated for in the weld control by determining and removing the voltage errors associated with a portion of a weld waveform from the feedback signal.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method, comprising:
receiving first data corresponding to a first weld waveform generated during a welding operation, wherein the first weld waveform corresponds to a voltage level over time;
receiving second data corresponding to a second weld waveform generated during the welding operation, wherein the second weld waveform corresponds to a current level over time;
determining, based on the first data, a first ratio corresponding to a voltage ramp ratio or a voltage falling edge ratio with respect to a peak in the first weld waveform;
determining, based on the second data, a second ratio corresponding to a current ramp ratio or a current falling edge ratio with respect to a peak in the second weld waveform;
determining, based on a comparison between the first ratio and the second ratio, a voltage for the welding operation that compensates for an inductance level present in one or more secondary components associated with the welding operation; and
controlling the welding operation in accordance with the determined voltage.

2. The method of claim 1, wherein the first ratio corresponds to the voltage ramp ratio and determining the voltage ramp ratio comprises dividing a normalized ramp voltage by a normalized peak voltage.

3. The method of claim 1, wherein the second ratio corresponds to the current ramp ratio and determining the current ramp ratio comprises dividing a normalized ramp current by a normalized peak current.

4. The method of claim 1, wherein determining the voltage for the welding operation comprises calculating a voltage error and subtracting the voltage error from a measured voltage.

5. The method of claim 4, wherein calculating the voltage error comprises multiplying an incremented inductance value by the derivative of current with respect to time.

6. The method of claim 1, wherein the first ratio corresponds to the voltage falling edge ratio and determining the voltage falling edge ratio comprises dividing a normalized falling edge voltage by a normalized peak voltage.

7. The method of claim 1, wherein the second ratio corresponds to the current falling edge ratio and determining the current falling edge ratio comprises dividing a normalized falling edge current by a normalized peak current.

8. A method, comprising:
receiving first data corresponding to a first weld waveform generated during a welding operation, wherein the first weld waveform corresponds to a voltage level over time;
receiving second data corresponding to a second weld waveform generated during the welding operation, wherein the second weld waveform corresponds to a current level over time;
determining, based on the first data, a first ratio corresponding to a voltage ramp ratio or a voltage falling edge ratio with respect to a peak in the first weld waveform;
determining, based on the second data, a second ratio corresponding to a current ramp ratio or a current falling edge ratio with respect to a peak in the second weld waveform;
determining, based on a comparison between the first ratio and the second ratio, whether to increment, decrement, or maintain an inductance compensation estimation value corresponding to an estimated inductance present in one or more secondary components associated with the welding operation; and
controlling the welding operation based at least in part on the induction compensation estimation value.

9. The method of claim 8, comprising calculating a voltage for the welding operation by subtracting a voltage error term from a measured voltage, wherein the voltage error term accounts for an estimated voltage rise corresponding to the estimated inductance.

10. The method of claim 9, wherein the voltage error term comprises the inductance compensation estimation value multiplied by the derivative of the current level over time.

11. The method of claim 8, wherein determining the voltage ramp ratio or the voltage falling edge ratio comprises dividing a normalized ramp or falling edge voltage by a normalized peak voltage.

12. The method of claim 8, wherein determining the current ramp ratio or the current falling edge ratio comprises dividing a normalized ramp or falling edge current by a normalized peak current.

13. A welding system, comprising:
power conversion circuitry configured to convert primary power to welding power for a welding operation; and
a weld controller configured to:
receive first data corresponding to a first weld waveform generated during a welding operation, wherein the first weld waveform corresponds to a voltage level over time;
receive second data corresponding to a second weld waveform generated during the welding operation, wherein the second weld waveform corresponds to a current level over time;
determine, based on the first data, a first ratio corresponding to a voltage ramp ratio or a voltage falling edge ratio with respect to a peak in the first weld waveform;
determine, based on the second data, a second ratio corresponding to a current ramp ratio or a current falling edge ratio with respect to a peak in the second weld waveform;
determine, based on a comparison between the first ratio and the second ratio, a voltage for the welding operation that compensates for an inductance level present in one or more secondary components associated with the welding operation; and
control the power conversion circuitry to perform the welding operation in accordance with the determined voltage.

14. The welding system as defined in claim 13, wherein the first ratio corresponds to the voltage ramp ratio and determining the voltage ramp ratio comprises dividing a normalized ramp voltage by a normalized peak voltage.

15. The welding system as defined in claim 13, wherein the second ratio corresponds to the current ramp ratio and determining the current ramp ratio comprises dividing a normalized ramp current by a normalized peak current.

16. The welding system as defined in claim 13, determining the voltage for the welding operation comprises calculating a voltage error and subtracting the voltage error from a measured voltage.

17. The welding system as defined in claim 16, wherein calculating the voltage error comprises multiplying an incremented inductance value by the derivative of current with respect to time.

18. The welding system as defined in claim 13, wherein the first ratio corresponds to the voltage falling edge ratio and determining the voltage falling edge ratio comprises dividing a normalized falling edge voltage by a normalized peak voltage.

19. The welding system as defined in claim 13, wherein the second ratio corresponds to the current falling edge ratio and determining the current falling edge ratio comprises dividing a normalized falling edge current by a normalized peak current.

* * * * *